United States Patent
Lu

(10) Patent No.: US 8,832,617 B2
(45) Date of Patent: Sep. 9, 2014

(54) METHOD OF CALCULATING FET GATE RESISTANCE

(75) Inventor: Ning Lu, Essex Junction, VT (US)

(73) Assignee: International Business Machines Corporation, Armonk, NY (US)

(\*) Notice: Subject to any disclaimer, the term of this patent is extended or adjusted under 35 U.S.C. 154(b) by 801 days.

(21) Appl. No.: 13/038,460

(22) Filed: Mar. 2, 2011

(65) Prior Publication Data

US 2012/0226456 A1 Sep. 6, 2012

(51) Int. Cl.
*G06F 17/50* (2006.01)

(52) U.S. Cl.
USPC .......................................... 716/110

(58) Field of Classification Search
CPC ................................ G06F 17/30; G06F 17/50
USPC ........................................... 716/110
See application file for complete search history.

(56) References Cited

U.S. PATENT DOCUMENTS

| | | | |
|---|---|---|---|
| 5,636,130 A | 6/1997 | Salem et al. | |
| 6,110,219 A | 8/2000 | Jiang | |
| 6,550,041 B1 | 4/2003 | McBride | |
| 6,779,160 B2 | 8/2004 | Amishiro et al. | |
| 6,986,115 B2 \* | 1/2006 | Sakano | 716/113 |
| 7,519,930 B2 \* | 4/2009 | Mori | 716/106 |
| 2009/0106707 A1 \* | 4/2009 | Abadeer et al. | 716/1 |
| 2010/0037191 A1 \* | 2/2010 | Kosuge | 716/5 |

OTHER PUBLICATIONS

Jin Xiaodong et al., "An Effective Gate Resistance Model for CMOS RF and Noise Modeling", IEEE, 1998, pp. 1-4.
Nobuyuki Itoh, "Circuit Level RF Modeling and Design", Book: Transistor Level Modeling for Analog/RF IC Design, 2006, pp. 181-207.
Ning Lu, Method of Modeling FET Gate Resistance, IBM Confidential, Feb. 11, 2010, pp. 1-4.
Mark Basel, "Interconnect vs. Device Parasitics", Mentor Graphics, www.eigroup.org/cmc/minutes/2q06_presentations/device_parasitics_cms_20060508.ppt., 2006, pp. 1-8.
Myounggon Kang, Extraction and Modeling of Physics-Based Gate Resistance Components in RF MOSFETs, IEEE, 2006, pp. 218-220.
R. Torres-Torres, "A New S-Parameter Measurement-Based Method for MOSFET Gate Resistance Extraction", http://www.essderc2002.deis.unibo.it/data/pdf/Torres2.pdf., 2002, pp. 1-4.

(Continued)

*Primary Examiner* — Vuthe Siek
*Assistant Examiner* — Mohammed Alam
(74) *Attorney, Agent, or Firm* — Gibb & Riley, LLC; Anthony J. Canale

(57) ABSTRACT

A method and device determine FET gate resistance based on both polysilicon resistance and the resistance values of wires and contacts connected to the gate node, plus the fraction of the electric current in each wire segment and in each contact and the path length of electric current in polysilicon. A new gate resistance expression (i.e., a master equation) is used for total gate resistance, which is the sum of core gate resistance and the resistance of wires and contacts connecting polysilicon and a gate node. When there are two or more paths for electric current going from polysilicon to the gate node, the total resistance also depends on the direction and path length of electric current in polysilicon, and the method and device next determine the fraction of electric current in each path by minimizing total resistance with respect to the fractions of the electric current in each path.

24 Claims, 17 Drawing Sheets

(56) References Cited

OTHER PUBLICATIONS

X. Xi, et al., "BSIM4.3.0 MOSFET Model, User's Manual", UC Berkeley, 2003. See Chapter 8, "High-speed/RF models", Eq. (8.1.9), Chapter 11, "Layout-dependent parasitics model", Eq. (11.2.1), and Appendix A.11 "Layout-dependent parasitics model parameters".

W. Liu, "MOSFET models for SPICE simulation, including BSIM3v3 and BSIM4", John Wiley & Sons, Inc., 2001, p. 317.

N. Lu and B. Dewey, "Characterization, simulation, and modeling of FET source/drain diffusion resistance", IEEE 2008 Custom Intergrated Circuits Conference (CICC), Proc. CICC, 2008, pp. 281-284.

* cited by examiner

US 8,832,617 B2

METHOD OF CALCULATING FET GATE RESISTANCE

BACKGROUND

The present invention generally relates to calculating resistance values, and more specifically, to methods, systems, and computer-implemented programs that calculate the resistance of conductors, such as gate conductors, where the gate conductors include multiple finger projections and/or have multiple contact points.

When designing structures such as integrated circuit devices, it is important to be able to accurately calculate the resistance values of the various conductors that will be utilize within the structures. In one example, transistor devices such as field effect transistors (FETs); complementary metal oxide semiconductor (CMOS) devices; diodes; varactors; etc., utilized conductors such as gate conductors, emitters, source, drain, base, collectors, etc. When designing such devices, knowing the resistance value of such conductors allows the designer to more accurately model the design.

SUMMARY

One exemplary computer-implemented method herein determines the resistance of a gate conductor in a transistor. The method receives, by a computerized device, a structural design comprising a conductor having a first conductor portion and a second conductor portion, a first wire connected to the first conductor portion, a second wire connected to the second conductor portion, and a node connected to the first wire and the second wire. The first wire has a first length between the first conductor portion and the node, and the second wire has a second length between the second conductor portion and the node. The first length is different from the second length in general. The method determines, using the computerized device, a first resistance value comprising resistances of the first wire and the first conductor portion. The method determines, using the computerized device, a second resistance value comprising resistances of the second wire and the second conductor portion. The first resistance value is different from the second resistance value in general. The method determines a total resistance expression using a master equation. The total resistance expression contains the fractions of the electric current in each path when there are two or more paths for gate electric current. The method determines a first fraction of current that will flow from the gate node through the first wire and the first conductor portion and a second fraction of current that will flow from the gate node through the second wire and the second conductor portion using a resistance minimization principle. The method calculates, using the computerized device, a final total resistance value of the conductor, the first wire, and the second wire based on the first fraction of current and the first resistance value, and based on the second fraction of current and the second resistance value.

Another exemplary computer-implemented method determines resistance of a multi-finger transistor. The method receives, by the computerized device, a structural design comprising a conductor and a node connected to a node connection location of the conductor. The conductor has an elongated base and a plurality of parallel finger projections extending from the base. The finger projections extend in a direction perpendicular to a linear direction of the base. The method determines, using a master equation, a plurality of finger projection resistance values, one for each of the finger projections. Each finger projection resistance value includes the resistance of a corresponding finger projection (of the finger projections) and a portion of the base between the node connection location and a second location where the corresponding finger projection contacts the base. The method determines, using actual finger connection scheme, a separate fraction of current that will flow from the gate node connection location to each of the finger projections. The method calculates, using a master equation, a final total resistance value of the base (i.e., tab), and the finger projections based on the fraction of current that will flow to each of the finger projections and each of the finger projection resistance values.

An additional computer-implemented method herein determines resistance of a multi-finger transistor having multiple contact points. The method receives, by the computerized device, a structural design comprising a conductor, and a plurality of different length wires connected to wire connection locations of the conductor. The conductor has a plurality of elongated bases. The wires connect to a single gate node. The method determines, using the computerized device, a plurality of wire-base resistance values, one for each of the bases through each of the wires. Each wire-base resistance value includes a resistance of a corresponding wire (of the wires); and a corresponding base (of the bases). The method determines a total resistance expression using a master equation. The total resistance expression contains the fractions of the electric current in each path when there are two or more paths for gate electric current. The method determines, using a master equation, a separate fraction of current that will flow from the gate node connection location through each of the wires to each of the bases using a resistance minimization principle. The method calculates, using the computerized device, a final total resistance value of the wires and the bases based on the fraction of current that will flow to each of the bases and each of the wire-base resistance values.

BRIEF DESCRIPTION OF THE SEVERAL VIEWS OF THE DRAWINGS

The embodiments of the invention will be better understood from the following detailed description with reference to the drawings, which are not necessarily drawing to scale, and in which.

DETAILED DESCRIPTION

Figure 1:
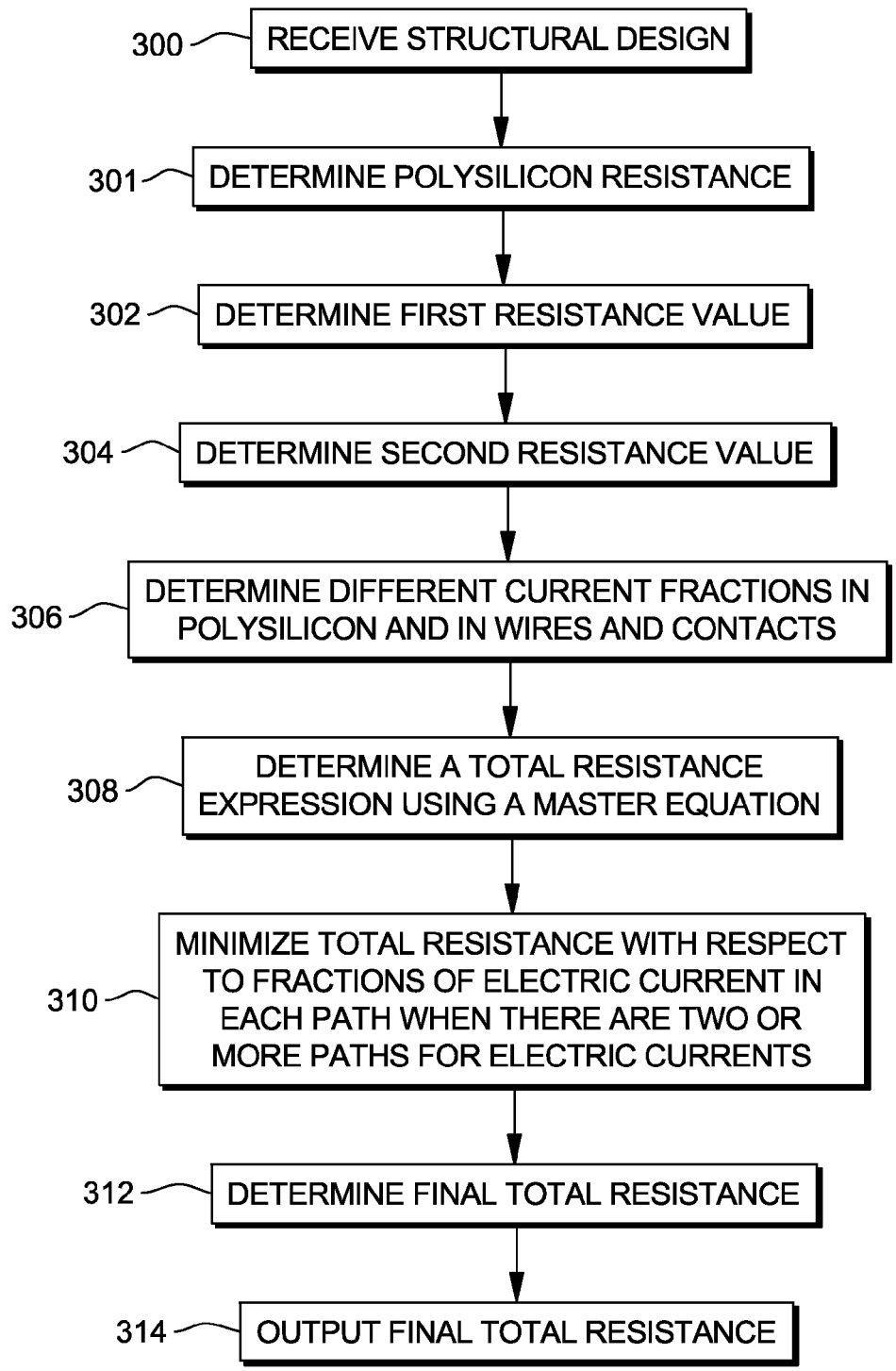
FIG. 1 is a flow diagram illustrating embodiments herein.

In the drawings, like numbering represents like elements between the drawings. As mentioned above, it is useful to accurately determine the resistance value of different conductors within device designs. While a limited number of transistor devices (field effect transistors) are discussed in the examples presented below, as would be understood by those ordinarily skilled in the art, the embodiments described below are applicable to all devices that use a conductor of any kind and are not limited to the examples shown in the drawings discussed below. The transistor devices provided in the following examples are merely utilized for convenience of illustration and are not the only structures to which the embodiments herein can be applied because, as would be apparent to those ordinarily skilled in the art, the embodiments herein can be applied to any form of conductor.

In order to provide accurate resistance value of conductors, one exemplary computer-implemented method herein is utilized to determine resistance of a gate conductor in a transistor. As shown in flowchart form in FIG. 1, this exemplary method receives a structural design comprising a conductor in item 300. Note that all steps performed in the different embodiments described herein can be performed automatically by a computerized device in a program of instructions, such as computer software code, that can be permanently stored in a non-transitory manner on a computer storage device that utilizes a computer readable storage medium.

Figure 4A:
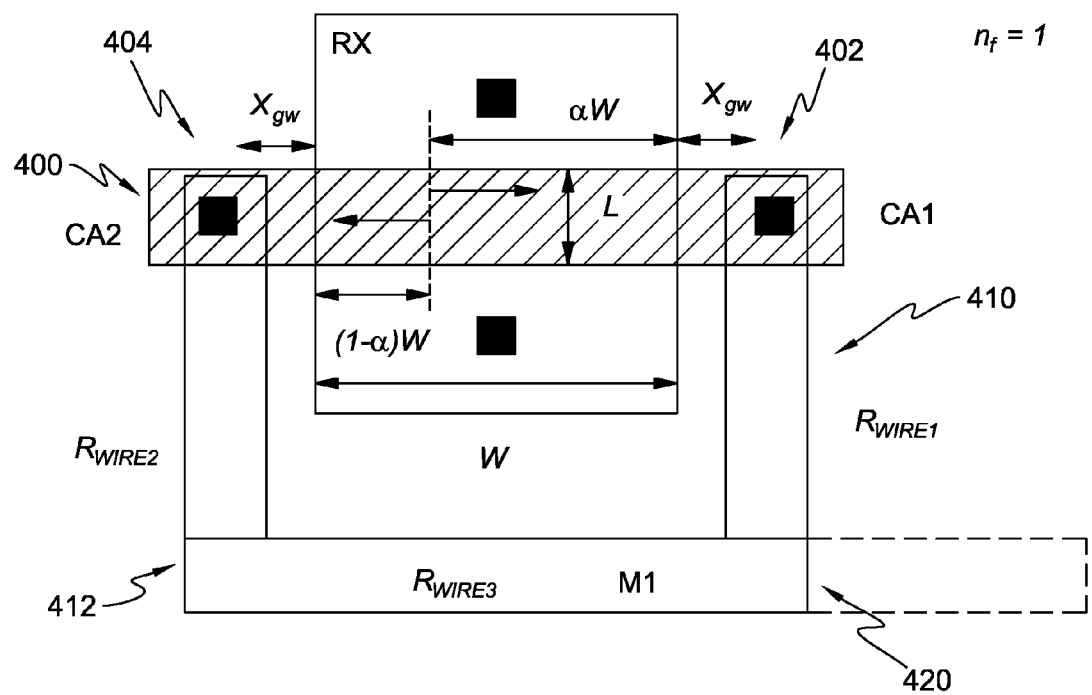
FIGS. 4A-4B are schematic diagrams of integrated circuit structures according to embodiments herein.

As illustrated in FIG. 4A an exemplary conductor 400 can be considered to have two portions (halves), a first conductor portion 402 (where contact CA1 is located) and a second conductor portion 404 (where contact CA2 is located). As shown in FIG. 4A, a first wire 410 (wire1) is connected to the first conductor portion, a second wire 412 (potentially made up of different wires, such as wire2 and wire3) is connected to the second conductor portion, and a node 420 is connected to the first wire 410 and the second wire 412. The first wire 410 has a first length between the first conductor portion 402 and the node 420, and the second wire 412 has a second length between the second conductor portion 404 and the node 420. The first length is different from the second length and, in the example shown in FIG. 4A, the second length (of the second wire 412) is longer than the first length (of the first wire 410).

Referring again to FIG. 1, this exemplary method receives a structural design in item 300. Next, the method determines polysilicon resistance in item 301. The method determines a first resistance value comprising resistances of the first wire and the first conductor portion in item 302. The method determines a second resistance value comprising resistances of the second wire and the second conductor portion in item 304. Because of the different lengths of the different wires, the first resistance value is different from the second resistance value. Further, the different wires can be made of different materials, have different widths, etc., which will further differentiate their resistance values. Additionally, the contacts (CA1, CA2) between the wires and the conductor can be different from one another (different materials, different sizes, etc.) and the geometry of the conductor may make one portion of the conductor have a different resistance and the other portion of the conductor.

Figure 4B:
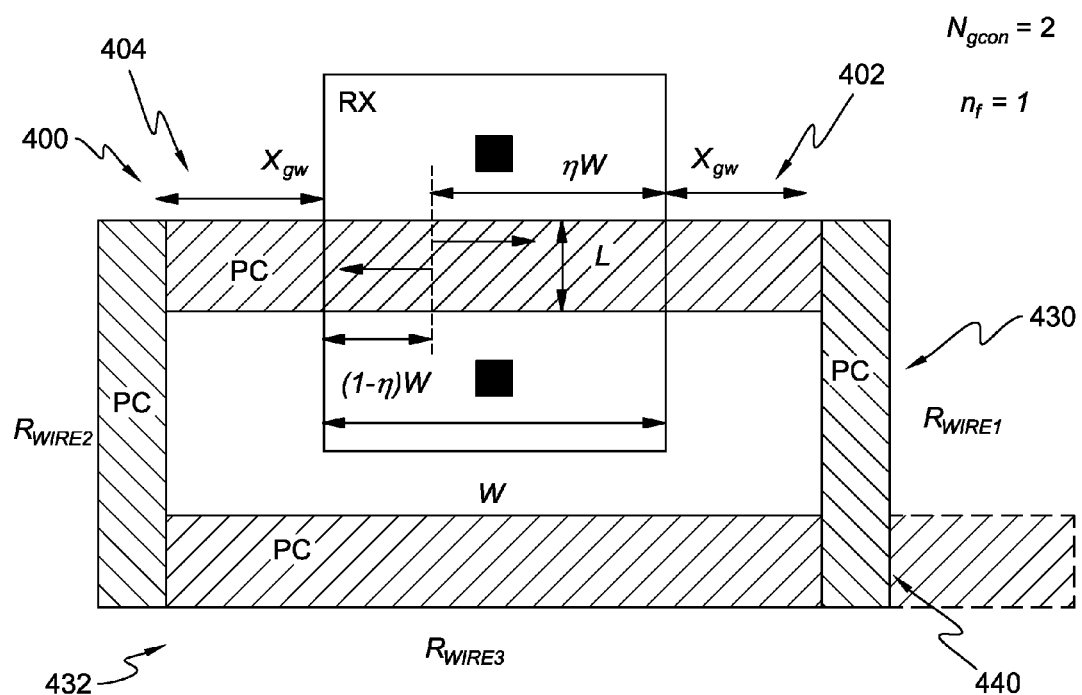

In one limited example, the conductor can comprise a polysilicon (PC) conductor while the wires may be metallic wires (M1) and the contacts may be metallic contacts (such as such as tungsten, hafnium, tantalum, molybdenum, titanium, or nickel, or a metal silicide, any alloys of such metals, etc.). In another example, as shown in FIG. 4B, the first wire 430, the second wire 432, and that gate node 440 can be formed from the same polysilicon that the gate conductor 400 is formed.

The method determines a total resistance expression using a master equation, which depends on the fraction of electric current in each path. The master equation expresses total resistance value as a weighted sum of resistance values of all resistive elements including polysilicons, wires, and contacts with the weight for each resistive element as the square of the fraction of the electric current that passes through the resistive element.

Relying on the differences between the first resistance value and the second resistance value, the method determines the current that will flow through the first wire and the first portion of the conductor relative to the fraction of current that will flow through the second wire and the second portion of the conductor (and contacts) in item 306. As is understood by those ordinarily skilled in the art, when a current is applied to the node, that current will seek the conductor that has the least amount of resistance. This causes the amount of current/voltage to be different on the first wire (and the first portion of the conductor) when compared to the second wire (and the second portion of the conductor). Therefore, in item 306, the method determines a first fraction of current that will flow from the node through the first wire and the first conductor portion; and determines a second fraction of current that will flow from the node through the second wire and the second conductor portion.

Next, the method determines the total resistance expression using a master equation in item 308. The method minimizes total resistance with respect to fractions of electric current in each path when there are two or more paths for electric currents in item 310. Then, in item 312, the method calculates a final total resistance value of the conductor, the first wire, and the second wire based on the first fraction of current and the first resistance value, and based on the second fraction of current and the second resistance value. In other words, once the percentage of current that flows through the first wire and the second wire is known (and the resistances of the different wires are known) the methods herein can calculate each separate resistance value to arrive at an overall resistance value that is seen at the node. This final total resistance value is then output in item 314. More specific mathematical calculations are provided in additional examples below.

Figure 2:
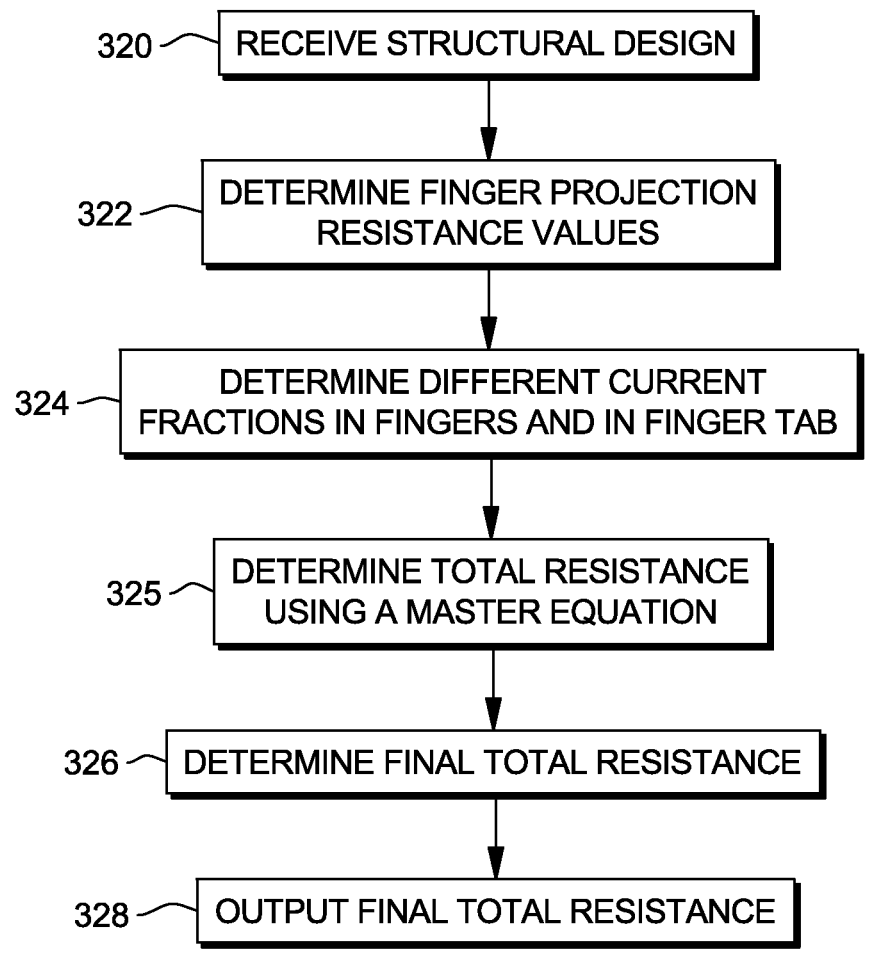
FIG. 2 is a flow diagram illustrating embodiments herein.
Figure 5A:
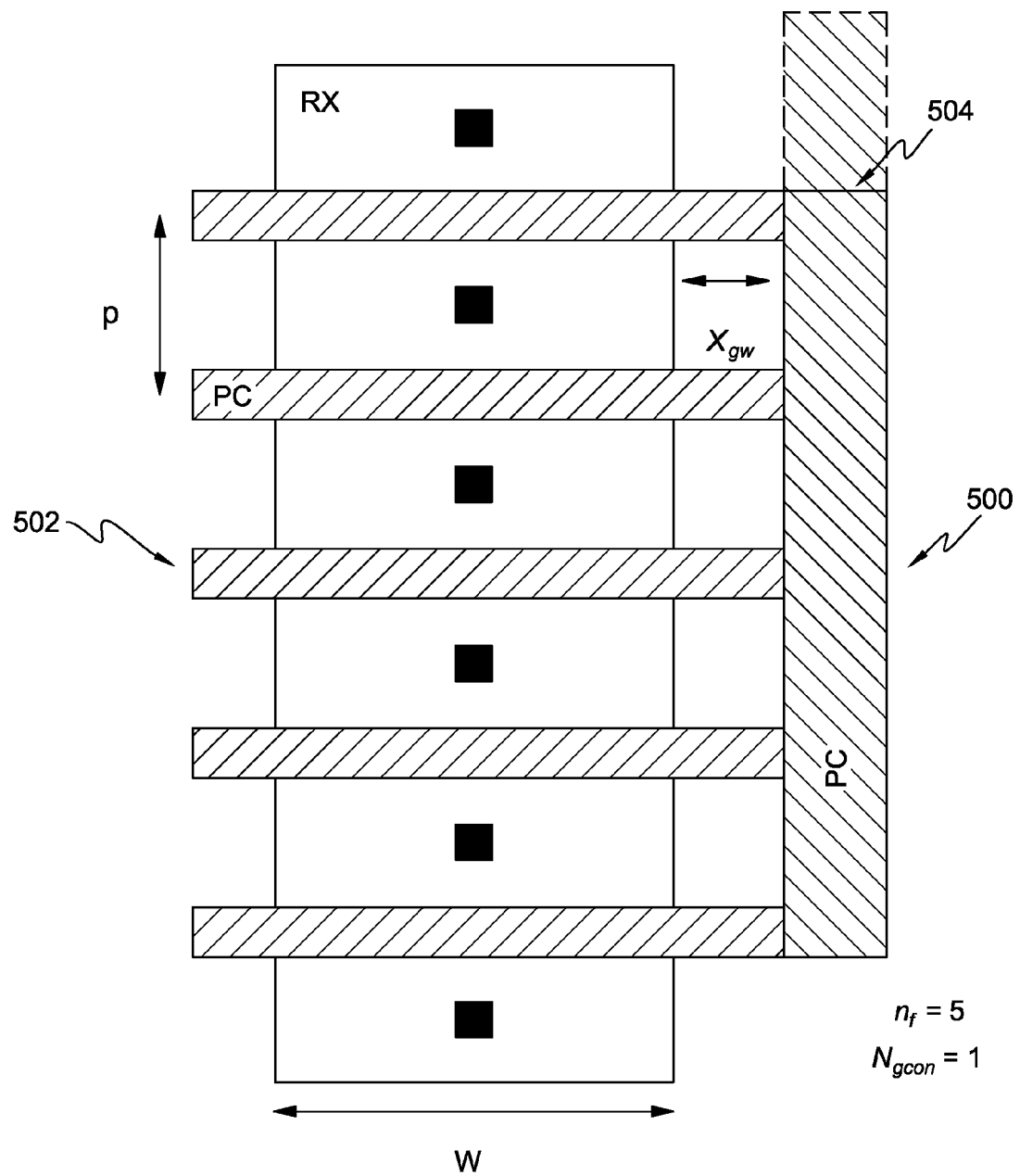
FIGS. 5A-5B are schematic diagrams of integrated circuit structures according to embodiments herein.

Another exemplary computer-implemented method herein determines resistance of a multi-finger transistor, and this method is illustrated in flowchart form in FIG. 2. In this example, the method receives, by the computerized device, a structural design in item 320. As illustrated in FIG. 5A, this structural design includes comprising a conductor and a node 504 connected to a node connection location of the conductor. The conductor has an elongated base 500 and a plurality of parallel finger projections 502 extending from the base 500. In the example shown in FIG. 5A, the node location is the end of the conductor base 500. The finger projections 502 extend in a direction perpendicular to a linear direction of the base 500.

Referring again to FIG. 2, the method receives a structural design in item 320. This exemplary method determines a plurality of finger projection resistance values, one for each of the finger projections in item 322. Each finger projection resistance value includes the resistance of a corresponding finger projection (of the finger projections) and a portion of the base between the node connection location and a second location where the corresponding finger projection contacts the base. As shown in FIG. 5A, each of the finger projections 502 is positioned progressively further from the node 504 and, therefore, each of the finger projection resistance values will be different because each finger projection resistance value includes an additional portion of the base 500 of the conductor. In addition, the finger projections 502 may have different widths, different lengths, be made of different materials, or have other differing physical characteristics that cause the finger projections to have different resistance values.

In item 324, the method determines a separate fraction of current that will flow from the gate node connection location to each of the finger projections based on a resistance minimization principle. The method determines the different current fractions in fingers and in finger tabs. The method determines total resistance using a master equation in item 325. The method then calculates a final total resistance value of the base and the finger projections (in item 326) based on the fraction of current that will flow to each of the finger projections and based on each of the finger projection resistance values. This final total resistance value is output in item 328.

Figure 5B:
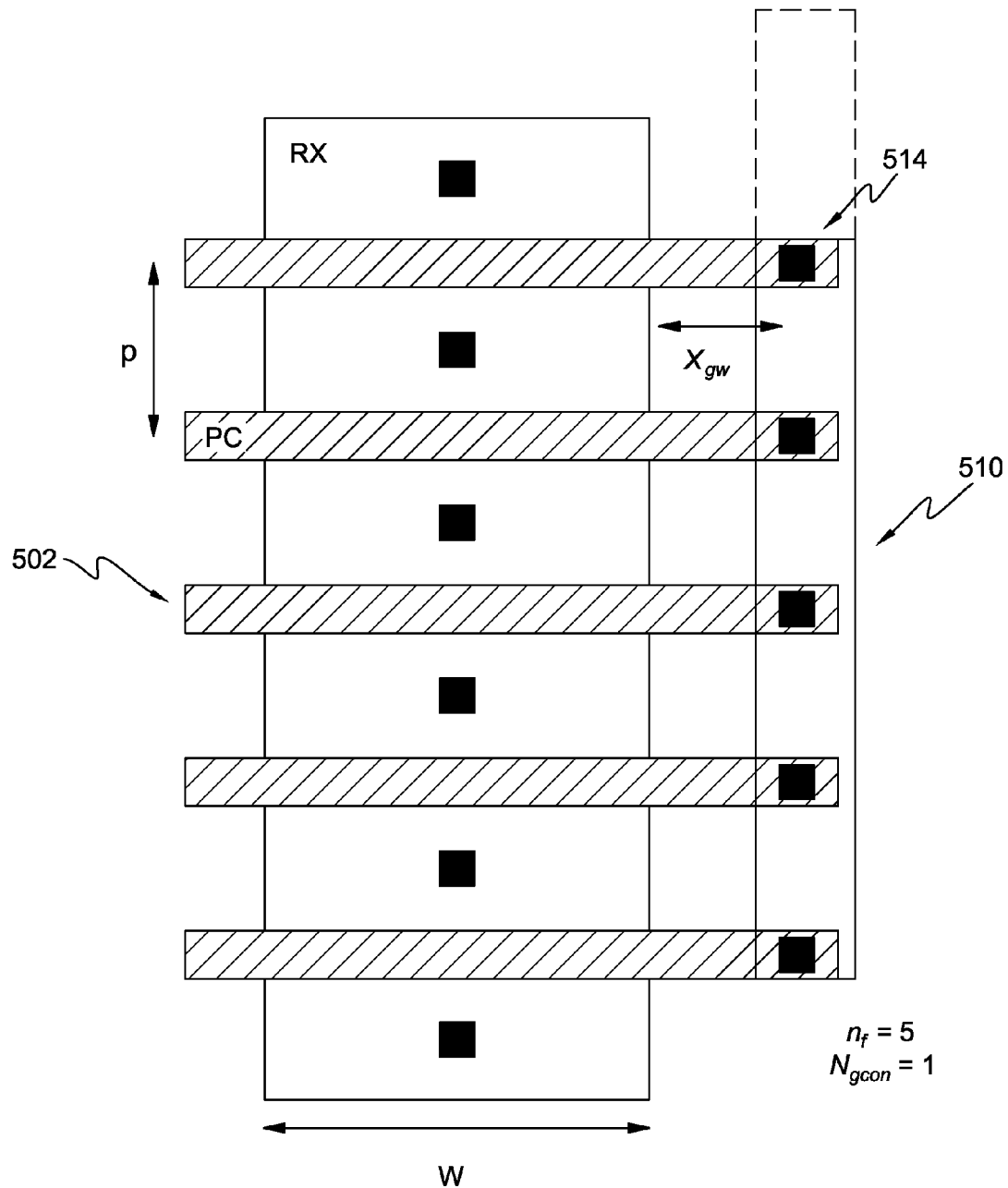

This process is similarly carried out on the structures illustrated in FIG. 5B with slight differences. More specifically, while the conductor base 500, finger projections 502, and the gate node 504 in FIG. 5A are all polysilicon conductors, as illustrated in FIG. 5B, the conductor base 510 and the gate node 514 are metallic conductors. As would be understood by those ordinarily skilled in the art, this change will cause a different resistance value calculation because of the material differences; however, the processing will remain the same.

Figure 6A:
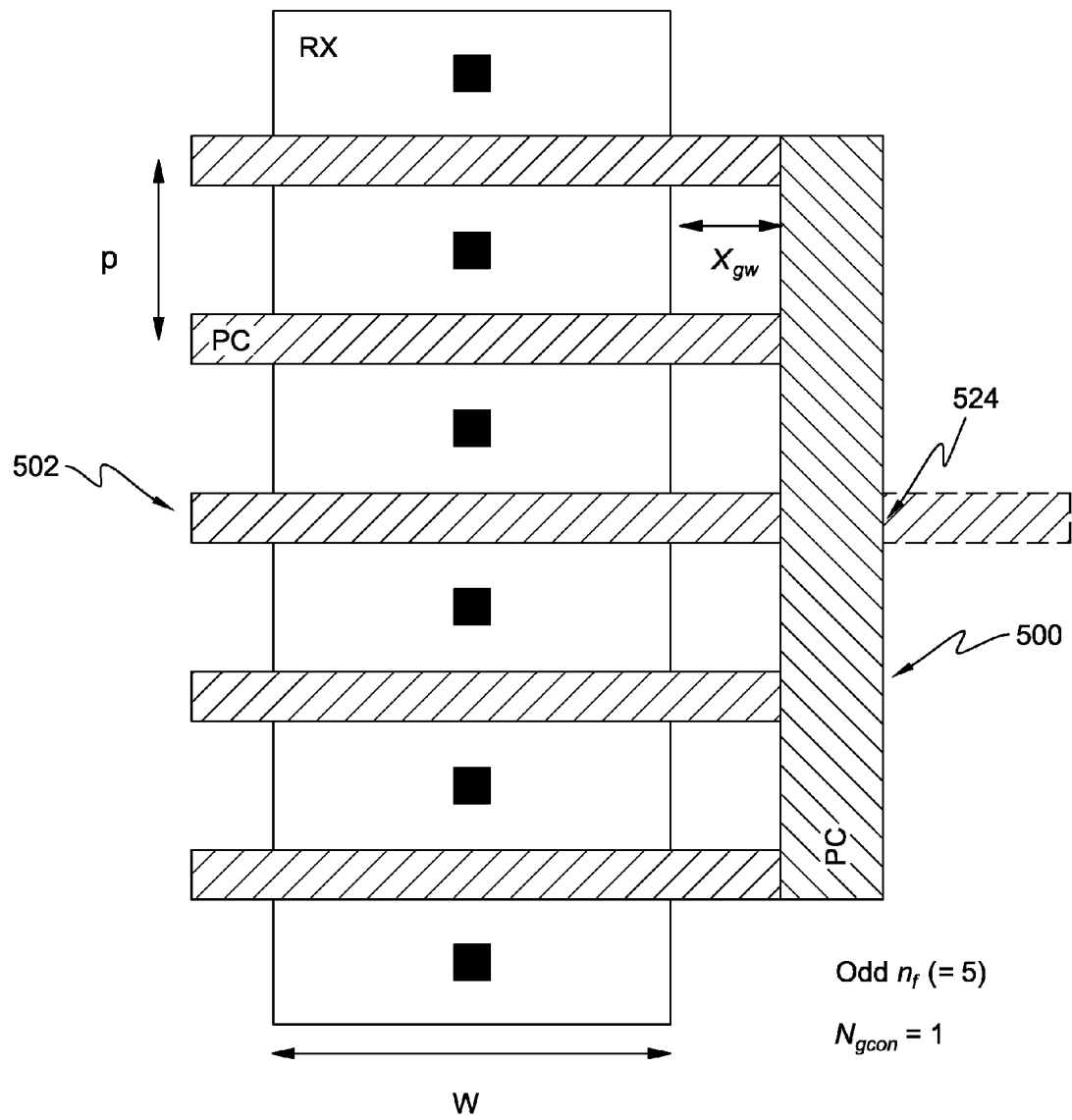
FIGS. 6A-6B are schematic diagrams of integrated circuit structures according to embodiments herein.
Figure 6B:
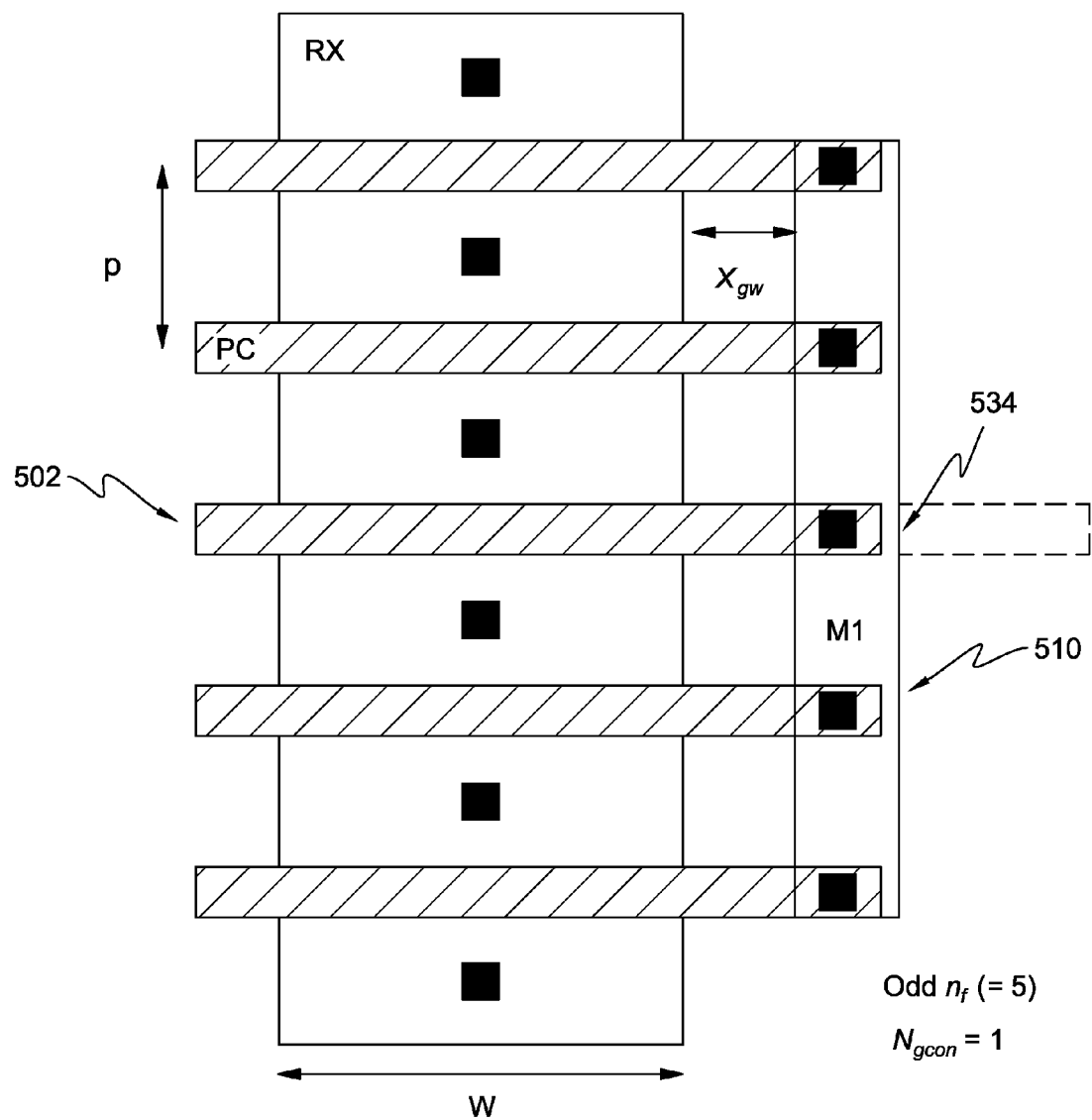
Figure 7A:
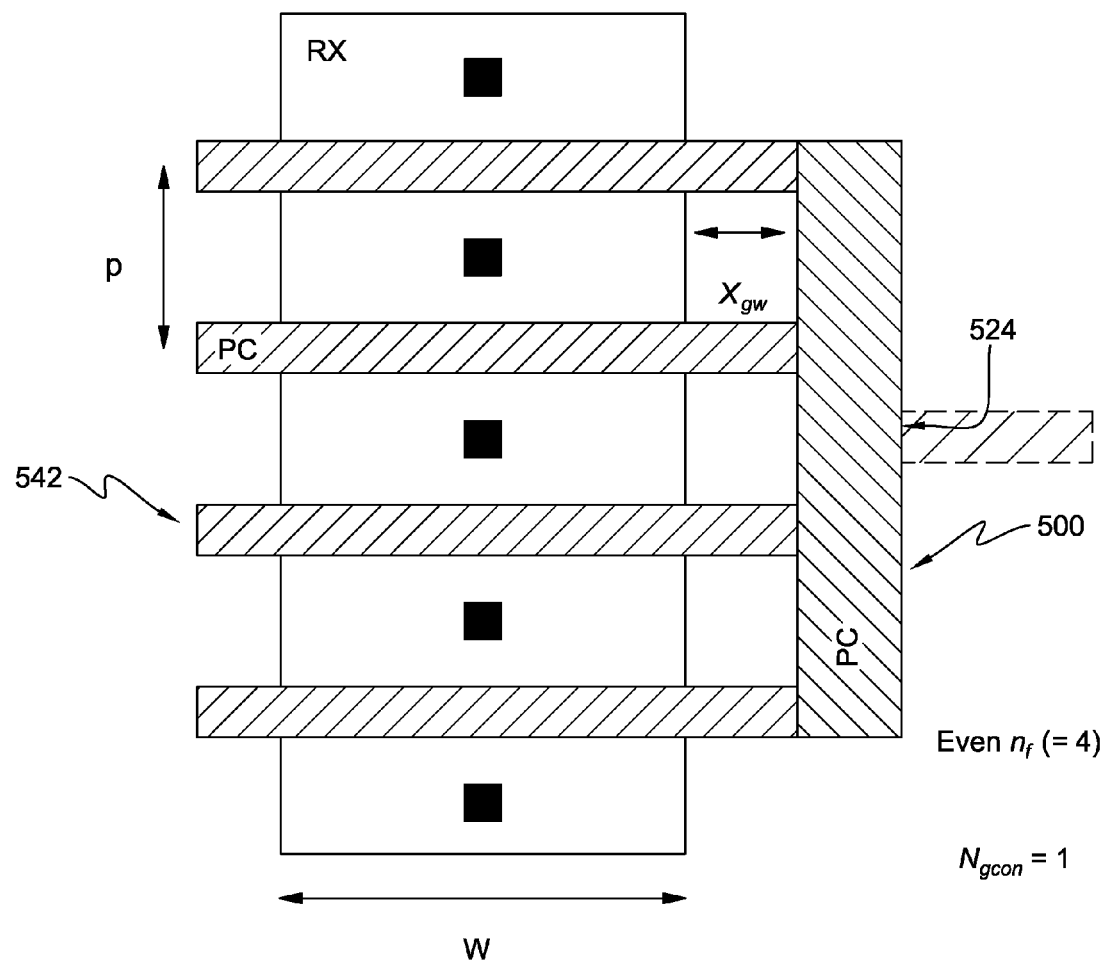
FIGS. 7A-7B are schematic diagrams of integrated circuit structures according to embodiments herein.

A similar structure is illustrated in FIG. 6A; however, the structure is different than that illustrated in FIG. 5A because the node location is repositioned from the end of the conductor base 500 to the center of the conductor base 500 where the gate node 524 is connected. The structure shown in FIG. 6B is similar to FIG. 6A except, again, the gate conductor base 510 is metallic, as is the gate node at 534. FIG. 7A illustrates another structural variation that includes an even number of finger projections 542 (contrasted with an odd number of finger projections 502 in FIG. 6A). FIG. 7B again substitutes the metallic gate conductor base 510 and gate node 534. However, despite these structural differences, the same processing shown in FIG. 2 is performed for all of the structures in order to provide an accurate resistance value at the gate node. Again, more specific mathematical calculations are provided in additional examples below.

Figure 3:
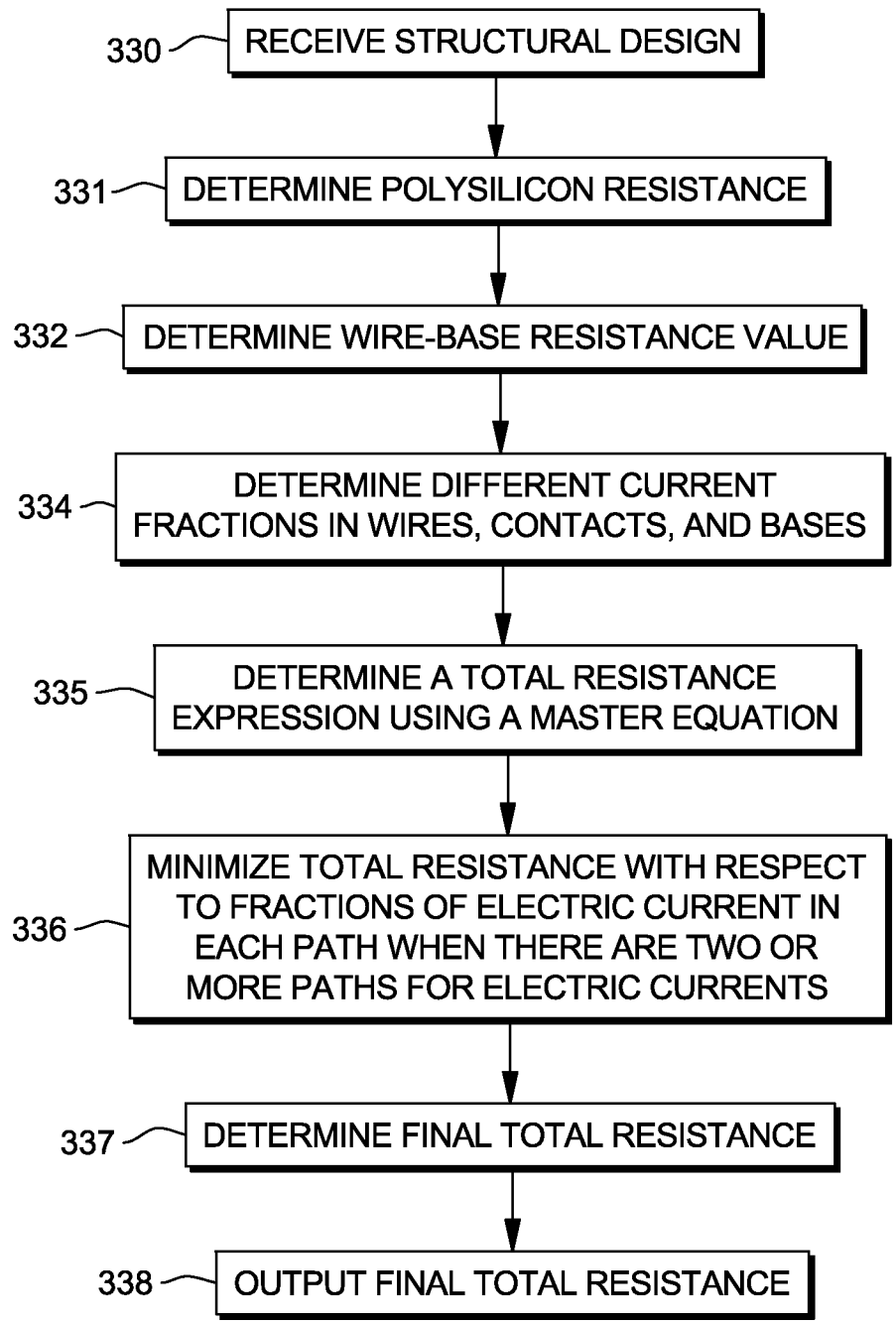
FIG. 3 is a flow diagram illustrating embodiments herein.
Figure 8:
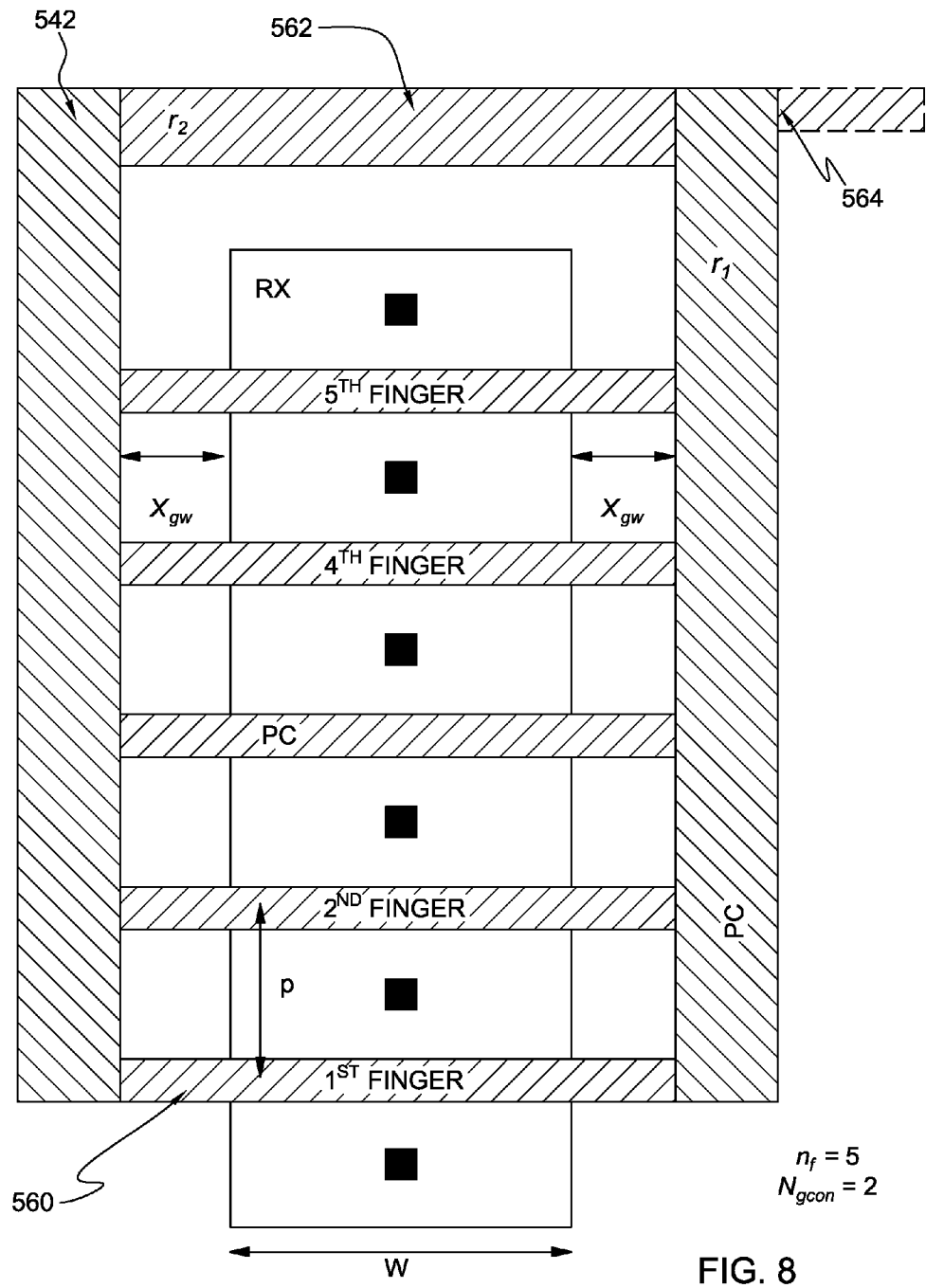
FIG. 8 is a schematic diagram of an integrated circuit structure according to embodiments herein.

FIG. 3 illustrates an additional computer-implemented exemplary method herein that determines the resistance of a multi-finger transistor having multiple contact points. As shown in item 330, this method receives a structural design. In item 331, the method determines the polysilicon resistance. As illustrated in FIG. 8, this structural design comprises a conductor and a plurality of different length wires 562 connected to wire connection locations of the conductor. The conductor has a plurality of elongated parallel bases or finger projections 560. The wires 562 connect to a single node 564.

Referring again to FIG. 3, in item 332 the method determines a plurality of wire-base resistance values, one for each of the bases through each of the wires. Each wire-base resistance value found in item 332 includes the resistance of a corresponding wire (of the wires) and a corresponding base (of the bases). In item 335, the method determines a total resistance expression using a master equation, which depends on the fraction of electric current in each path. In item 334, the method determines a separate fraction of current that will flow from the node connection location through each of the wires to each of the bases, based on a resistance minimization principle. In item 334, the method also determines the different current fractions in the wires, contacts, and bases. In item 336, the method minimizes resistance with respect to fractions of electric current in each path when there are two or more paths for electric currents. In item 337, the method calculates a final total resistance value of the wires and the bases based on the amount of current that will flow to each of the bases and each of the wire-base resistance values, and outputs this final total value in item 338.

An elaborate FET gate resistance model is used in BSIM4 model, $$R_{g,BSIM} = \frac{R_{sg}[X_{gw} + W/(3N_{gcon})]}{N_{gcon}(L_{drawn} - dl)n_f}, \quad (1)$$

where $R_{sg}$ is the sheet resistance of poly gate, W is an effective FET width, $X_{gw}$ is the distance from the gate contact to the channel edge, $N_{gcon}$ is the number of gate contacts (either 1 or 2 typically), dl is the offset of the gate length due to variations in patterning, and $n_f$ is the number of gate fingers (see FIG. 4). This formula seems very accurate, since many effects are taken into account. However, the formula loses some accuracy when a gate is contacted from both ends ($N_{gcon}=2$), and/or when a FET has multiple gate fingers (i.e., when $n_f \geq 2$) as shown above.

The embodiments herein more accurately model the gate resistance of FET, MOS varactor, etc., especially when a gate of FET, MOS varactor, etc. is contacted from both ends, and/or when a FET has multiple gate fingers. In the following examples, $R_g$ is gate resistance; L is generally FET channel length; W is generally FET channel width; $L_{drawn}$, is design length; $R_{CA1}$, $R_{CA2}$, are the resistances of the various contacts; $R_{wire1}$, $R_{wire2}$, $R_{wire3}$, which are the resistances of the various wires; $R_{tot}$ is the total resistance seen from the gate node; $r_0$ is the resistance of core gate part when transmission line effect is not included; α denotes the fraction of gate width for which all electric current in it goes in the same direction; RX is the active area of the semiconductor region; and p is generally the pitch of fingers. More specifically, the embodiment herein uses a master equation $$R_{tot} = \sum_{m=1}^{M} \left(\frac{I_m}{I_{tot}}\right)^2 R_m \quad (2)$$

$$= \sum_{m=1}^{M} \alpha_m^2 R_m \quad (3)$$

to model gate resistance in all cases. In Eq. (2), $I_m$ is the electric current passes through the $m^{th}$ resistive element $R_m$ of a given gate structure, and $I_{tot}$ is the total electric current passes through the given gate (i.e., the total electric current at the gate node, 420 in FIG. 4A, 440 in FIG. 4B, 504 in FIG. 5A, 514 in FIG. 5B, 524 in FIG. 6A, 534 in FIG. 6B, 524 in FIG. 7A, 534 in FIG. 7B, and 564 FIG. 8). In Eq. (3), $$\alpha_m = \frac{I_m}{I_{tot}}, \quad (4)$$

$$m = 1, 2, \ldots, M,$$

is the fraction of the electric current passes through the $m^{th}$ resistive element $R_m$ of the given gate structure.

The embodiment first consider cases in which the gate of a single-finger FET (or a MOS varactor, etc.) is contacted from both ends ($N_{gcon}=2$, $n_f=1$), as shown in FIGS. 4A and 4B. The $1^{st}$ resistance value is $$R_1 = r_e + kR_{CA1} + R_{wire1}, \quad (5)$$

where $$r_e = \frac{R_{sg} X_{gw}}{L_{drawn} - X_{gl}}, \quad (6a)$$

and the corresponding current fraction is $$\alpha_1 = \alpha. \quad (6b)$$

The $2^{nd}$ resistance value is $$R_2 = r_e + kR_{CA2} + R_{wire2} + R_{wire3}, \quad (7a)$$

and the corresponding current fraction is $$\alpha_2 = 1 - \alpha. \quad (7b)$$

In Equations (5) and (7a), k=1 in FIG. 4A and k=0 in FIG. 4B. To calculate the polysilicon (PC) intersect diffusion (RX) part of gate resistance, the poly is divided into two portions. The right portion has a width $\alpha W$, and the electric current flows towards the right direction, $$R_3 = \frac{1}{3} \alpha r_0, \quad (8a)$$

where $$r_0 = \frac{R_{sg} W}{L_{drawn} - dl}, \quad (8b)$$

and the current fraction is $\alpha$, $$\alpha_3 = \alpha. \quad (8c)$$

The left portion has a width $(1-\alpha)W$, and the electric current flows towards the opposite (i.e., the left) direction, $$R_4 = \frac{1}{3}(1-\alpha) r_0, \quad (9a)$$

and the current fraction is $$\alpha_4 = 1 - \alpha. \quad (9b)$$

Equations (8a) and (9a), the multiplier ⅓ comes from the transmission line effect for gate resistance. Substituting Equations (5)-(9) into the master equation (3), the total resistance (i.e., the sum of gate resistance, contact, and wire resistances) is seen at the gate node, $$R_{tot} = \alpha^2 \left( \frac{1}{3} \alpha r_0 + R_1 \right) + (1-\alpha)^2 \left[ \frac{1}{3}(1-\alpha) r_0 + R_2 \right]. \quad (10a)$$

Within the total resistance, the typically called gate resistance is $$R_g = \alpha^2 \left( \frac{1}{3} \alpha r_0 + r_e \right) + (1-\alpha)^2 \left[ \frac{1}{3}(1-\alpha) r_0 + r_e \right]. \quad (10b)$$

When there are two or more paths for a portion of gate current to reach the gate node, the value of current fraction $\alpha$ value is undetermined so far. To determine the value of current fraction $\alpha$, the embodiment says that the gate current will split in such a way that the total resistance reaches its smallest value as a function of $\alpha$. Using such a resistance minimization principle, the embodiments herein next set $$\frac{dR_{tot}}{d\alpha} = 0, \quad (11)$$

and subsequently get the fraction of gate current which goes through $R_1$, $$\alpha = \frac{\frac{1}{2} r_0 + R_2}{r_0 + R_1 + R_2} = \frac{1}{2} + \frac{D}{2A}, \quad (12a)$$

and also get the fraction of gate current which goes through $R_2$, $$1 - \alpha = \frac{\frac{1}{2} r_0 + R_1}{r_0 + R_1 + R_2} = \frac{1}{2} - \frac{D}{2A}. \quad (12b)$$

In Equation (12), D is the resistance difference, $$D = R_2 - R_1, \quad (13b)$$

and A is the sum of all resistance elements, $$A = r_0 + R_1 + R_2. \quad (13b)$$

Substituting Eqs. (12) into Eq. (10a), the total resistance is found to be, $$R_{tot} = \frac{r_0}{12} + \frac{R_1}{2} + \frac{D^2}{A^2}\left(\frac{r_0}{4} + \frac{R_1}{2}\right) + \frac{D}{4}\left(1 - \frac{D}{A}\right)^2. \quad (14)$$

Substituting Eqs. (12) into Eq. (10b), the gate resistance (apart of total resistance) is obtained as $$R_g = \frac{r_0}{12} + \frac{r_e}{2} + \frac{D^2}{A^2}\left(\frac{r_0}{4} + \frac{r_e}{2}\right). \quad (15)$$

When $R_1$ is equal to $R_2$ (or when $r_0$ is much larger than both $R_1$ and $R_2$), Eq. (12a) gives $\alpha=0.5$, namely, half of gate current ($\alpha=50\%$) goes to the right direction (i.e., passing through $R_1$) and the other half ($1-\alpha=50\%$) goes to the left direction (i.e., passing through $R_2$), and the gate resistance becomes $$R_g = \frac{r_0}{12} + \frac{r_e}{2}, \text{ when } R_1 = R_2, \quad (16)$$

so that Eq. (1) is correct. When $R_1 \neq R_2$, however, the current that goes through $R_1$ is different from the current goes through $R_2$ (i.e., $\alpha \neq 50\%$). For example, when $R_2 \gg r_0, R_1$, the ratio D/A is approximately one, and thus almost all current ($\alpha \approx 100\%$) goes to the right direction (i.e., passing through $R_1$), the gate resistance becomes $$R_g \approx \frac{r_0}{3} + r_e, \text{ when } R_2 \gg r_0, R_1. \quad (17)$$

Another example: In an opposite case, when $R_1 \gg r_0, R_2$, almost all current ($1-\alpha \approx 100\%$) goes to the left direction (i.e., passing through $R_2$), and the gate resistance is also given by Eq. (17). In general, the percentage of gate current goes to the right direction (i.e., the value of $\alpha$) depends on the ratio D/A, and so does the gate resistance $R_g$.

Figure 7B:
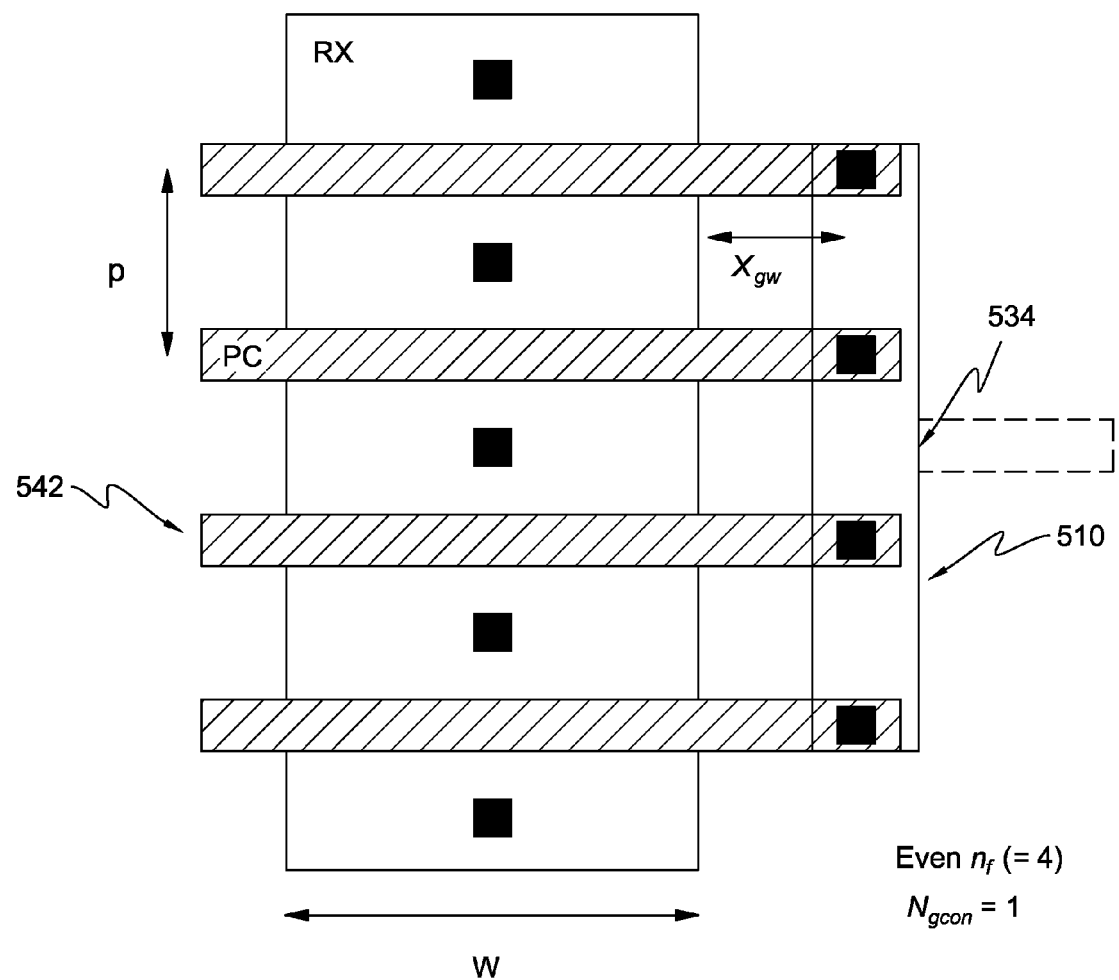

Next, the embodiment consider cases in which a polysilicon gate of a multi-finger FET (or a multi-finger MOS varactor, etc.) that is contacted from one end ($N_{gcon}=1$, $n_f \geq 2$). In FIGS. 5A, 5B, 6A, 6B, 7A and 7B, the embodiments herein denote the poly pitch of a multi-finger FET as p, and denote $$R_c = r_e + kR_{CA}, \quad (18)$$

with k=0 in FIGS. 5A, 6A, and 7A, and k=1 in FIGS. 5B, 6B, and 7B, and denote $R_t$ as the unit-length resistance of the tab wire (either polysilicon or metal) connecting multiple fingers.

As shown in FIGS. 5A and 5B, when each gate finger is connected at one end, there is only one path for the electric current in each finger, and fraction of the electric current in each finger is $1/n_f$, $$\alpha_m^{(finger)} = \frac{1}{n_f}, \quad (19a)$$

$$m = 1, 2, \ldots, n_f,$$

and the resistance in each finger is $$R_m^{(finger)} = \frac{1}{3}r_0 + R_c, \quad (19b)$$

$$m = 1, 2, \ldots, n_f.$$

For the tab part, the resistance in each segment is the same, $$R_m^{(tab)} = pR_t, \quad m = 1, 2, \ldots, n_f - 1, \quad (20)$$

but the fraction of the electric current in each segment of tab increases as one moves closer to the gate node 514, $$\alpha_m^{(tab)} = \frac{m}{n_f}, \quad (21)$$

$$m = 1, 2, \ldots, n_f - 1.$$

Substitution of Equations (19), (20), and (21) into the master equation (3) gives the total resistance at the gate node (excluding the resistance in the dashed wire line), $$R_{tot} = \sum_{m=1}^{n_f} [\alpha_m^{(finger)}]^2 R_m^{(finger)} + \sum_{m=1}^{n_f-1} [\alpha_m^{(tab)}]^2 R_m^{(tab)} \quad (22)$$

$$= \frac{(r_0/3) + R_c}{n_f} + \frac{1}{n_f^2} \sum_{m=1}^{n_f-1} m^2 pR_t$$

$$= \frac{(r_0/3) + R_c}{n_f} + \frac{(n_f-1)(2n_f-1)}{6n_f} pR_t.$$

As shown in FIGS. 6A and 6B, when the gate is connected at the middle finger and the finger number is odd, Equations (19) and (20) are still valid, and only Equation (21) needs a modification, $$\alpha_m^{(tab)} = \alpha_{n_f-m}^{(tab)} = \frac{m}{n_f}, \quad (23)$$

$$m = 1, 2, \ldots, (n_f-1)/2.$$

After substituting Equations (19), (20), and (23) into the master equation (3), the embodiment obtains the total resistance at the gate node (excluding the resistance in the dashed wire line), $$R_{tot} = \sum_{m=1}^{n_f} [\alpha_m^{(finger)}]^2 R_m^{(finger)} + \sum_{m=1}^{n_f-1} [\alpha_m^{(tab)}]^2 R_m^{(tab)} \quad (24)$$

$$= \frac{(r_0/3) + R_c}{n_f} + \frac{2}{n_f^2} \sum_{m=1}^{(n_f-1)/2} m^2 pR_t$$

$$= \frac{(r_0/3) + R_c}{n_f} + \frac{n_f^2 - 1}{12n_f} pR_t.$$

Similarly, as shown in FIGS. 4A and 4B, when the gate is connected between the two middle fingers and the finger number is even, Equations (19) and (20) are still valid, and only Equation (24) needs a change, $$\alpha_m^{(tab)} = \alpha_{n_f-m}^{(tab)} = \frac{m}{n_f}, \quad (25)$$

$$m = 1, 2, \ldots, \frac{1}{2}n_f.$$

Substitution of Equations (19), (20), and (25) into the master equation (3) gives the total resistance at the gate node (excluding the resistance in the dashed wire line), $$R_{tot} = \sum_{m=1}^{n_f} [\alpha_m^{(finger)}]^2 R_m^{(finger)} + \sum_{m=1}^{n_f-1} [\alpha_m^{(tab)}]^2 R_m^{(tab)} \quad (26)$$

$$= \frac{(r_0/3) + R_c}{n_f} + \frac{2}{n_f^2} \sum_{m=1}^{n_f/2-1} m^2 pR_t + \left(\frac{1}{2}\right)^2 pR_t$$

$$= \frac{(r_0/3) + R_c}{n_f} + \frac{n_f^2 + 2}{12n_f} pR_t.$$

When the number of finger is large ($n_f \gg 1$), Eq. (22) reduces to $$R_{tot} = \frac{(r_0/3) + R_c}{n_f} + \frac{n_f p R_t}{3}, \quad (27)$$

and both Eqs. (24) and (26) reduce to $$R_{tot} = \frac{(r_0/3) + R_c}{n_f} + \frac{n_f p R_t}{12}. \quad (28)$$

Last, the embodiment considers cases in which the polysilicon of a multi-finger FET (or a multifinger MOS varactor, etc.) is contacted from both ends ($N_{gcon} \geq 2$, $n_f \geq 2$), as shown in FIG. 8. FIG. 8 shows a multi-finger FET contacted from both ends. Each of $n_f$ fingers has $1/n_f$ of total gate current. The electric currents in each finger flow in two opposite directions. For the $m^{th}$ finger, two values of electric current fraction are $$\left(\frac{1}{2} + \beta_m\right)\Big/n_f \text{ and } \left(\frac{1}{2} - \beta_m\right)\Big/n_f,$$

respectively. For the segment of finger tab between the $m^{th}$ finger and the $(m+1)^{th}$ finger, the two values of electric current fraction are $$\sum_{k=1}^{m} \left(\frac{1}{2} + \beta_k\right)\Big/n_f \text{ and } \sum_{k=1}^{m} \left(\frac{1}{2} - \beta_k\right)\Big/n_f,$$

respectively. Using the master equation (3), the total resistance seen at the gate node is $$R_{tot} = \sum_{m=1}^{n_f} \left[\left(\frac{\frac{1}{2}+\beta_m}{n_f}\right)^2 \left(\frac{\frac{1}{2}+\beta_m}{3}r_0 + r_e\right) + \left(\frac{\frac{1}{2}-\beta_m}{n_f}\right)^2 \left(\frac{\frac{1}{2}-\beta_m}{3}r_0 + r_e\right)\right] + \quad (29a)$$

$$\sum_{m=1}^{n_f-1} \left[\left(\sum_{k=1}^{m} \frac{\frac{1}{2}+\beta_k}{n_f}\right)^2 pR_t + \left(\sum_{k=1}^{m} \frac{\frac{1}{2}-\beta_k}{n_f}\right)^2 pR_t\right] + \left(\sum_{k=1}^{n_f} \frac{\frac{1}{2}+\beta_k}{n_f}\right)^2 r_1 + \left(\sum_{k=1}^{n_f} \frac{\frac{1}{2}-\beta_k}{n_f}\right)^2 r_2.$$

The above expression can be reduced to a quadratic expression of $\beta_k$, $k=1, 2, \ldots, n_f$, $$R_{tot} = \sum_{m=1}^{n_f} \left[\frac{1}{12}r_0 + \frac{1}{2}r_e + (r_0 + 2r_e)\beta_m^2\right] + \frac{1}{2}pR_t \sum_{m=1}^{n_f-1} m^2 + \frac{1}{2}r_1 n_f^2 + \quad (29b)$$

$$2pR_t \sum_{m=1}^{n_f-1} \left(\sum_{k=1}^{m} \beta_k\right)^2 + 2r_1 \left(\sum_{k=1}^{n_f} \beta_k\right)^2 + (r_2 - r_1)\left(\frac{n_f}{2} - \sum_{k=1}^{n_f} \beta_k\right)^2.$$

There are multiple paths for the electric current to reach the gate node 564. The electric currents will distribute themselves in such a way that the total resistance reaches its minimum value as a function of $\beta_k$, $k=1, 2, \ldots, n_f$. Namely, the values of $\beta_k$, $k=1, 2, \ldots, n_f$, can be found by setting $n_f$ partial derivatives to be zero, $$\frac{\partial R_{tot}}{\partial \beta_j} = 0, \quad (30)$$

$$j = 1, 2, \ldots, n_f.$$

Substitution of Equation (29b) into Equation (30) leads to a set of $n_f$ linear algebraic equations, $$\sum_{k=1}^{n_f} c_{jk} \beta_k = \frac{1}{2} n_f (r_2 - r_1), \quad (31a)$$

$$j = 1, 2, \ldots, n_f,$$

with $$c_{jk} = (r_0 + 2r_e)\delta_{jk} + 2pR_t[n_f - \max(j,k)] + r_1 + r_2, \, j,k=1, 2, \ldots, n_f. \quad (31b)$$

Equations (31a) are a set of $n_f$ linear algebraic equations for $n_f$ parameter $\beta_k$, $k=1, 2, \ldots, n_f$, and can be obtained easily by those skilled in the art. It is clear from Equations (31a) that all $\beta_k$ equal to zero when $r_2 = r_1$. However, $\beta_k$ are not equal to zero when $r_2$ and $r_1$ are different.

For other connection scheme of multi-finger FET contacted at both ends (e.g., the gate node is at a middle place on a tab), the total resistance seen at the gate node can be obtained similarly using the master equation (3) and using a minimization method on the amount of electric current that flows in each direction.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 9:
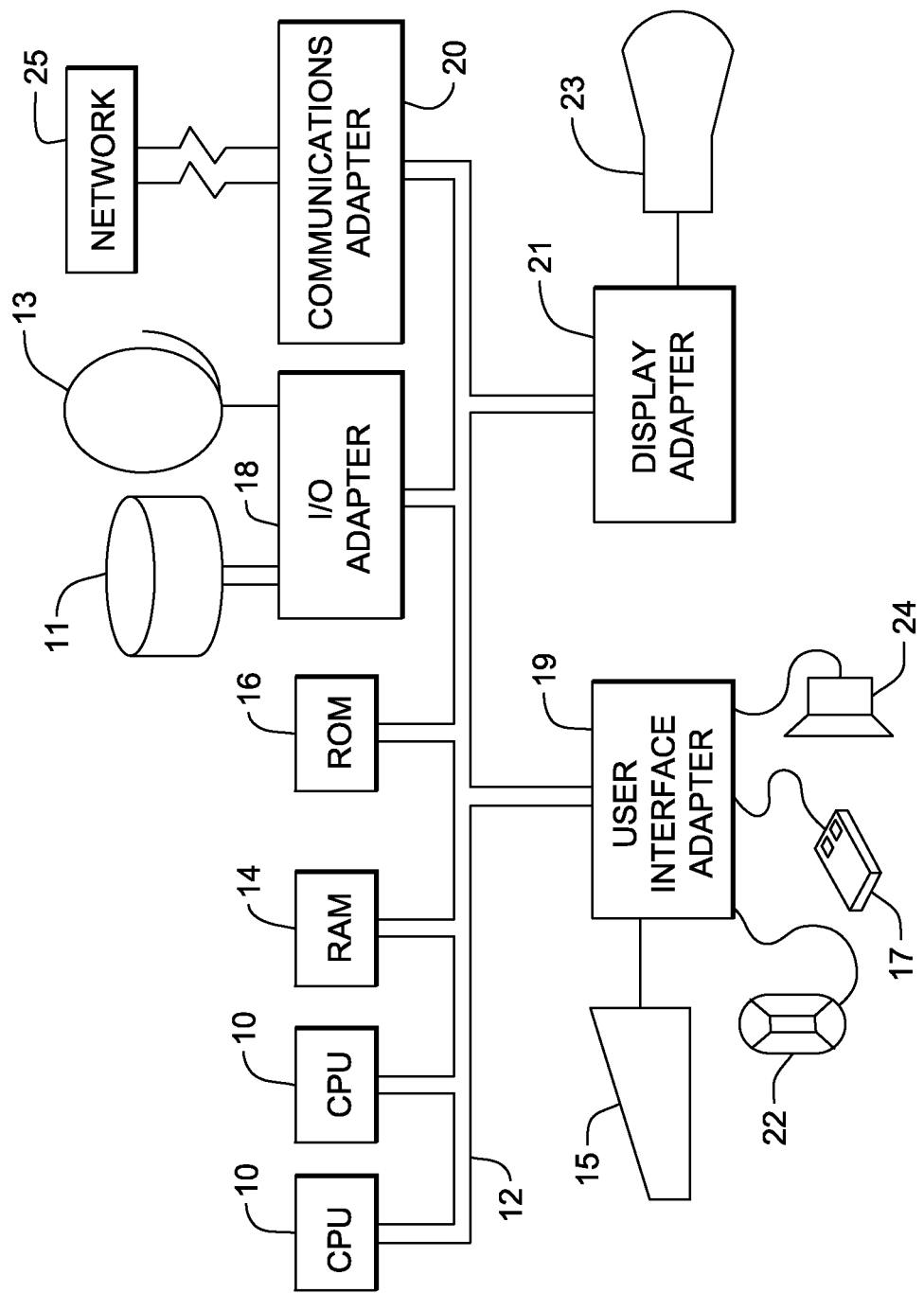
FIG. 9 is a schematic diagram of a hardware system according to embodiments herein.

A representative hardware environment for practicing the embodiments of the invention is depicted in FIG. 9. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment Types include loading directly in the client, server and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 10:
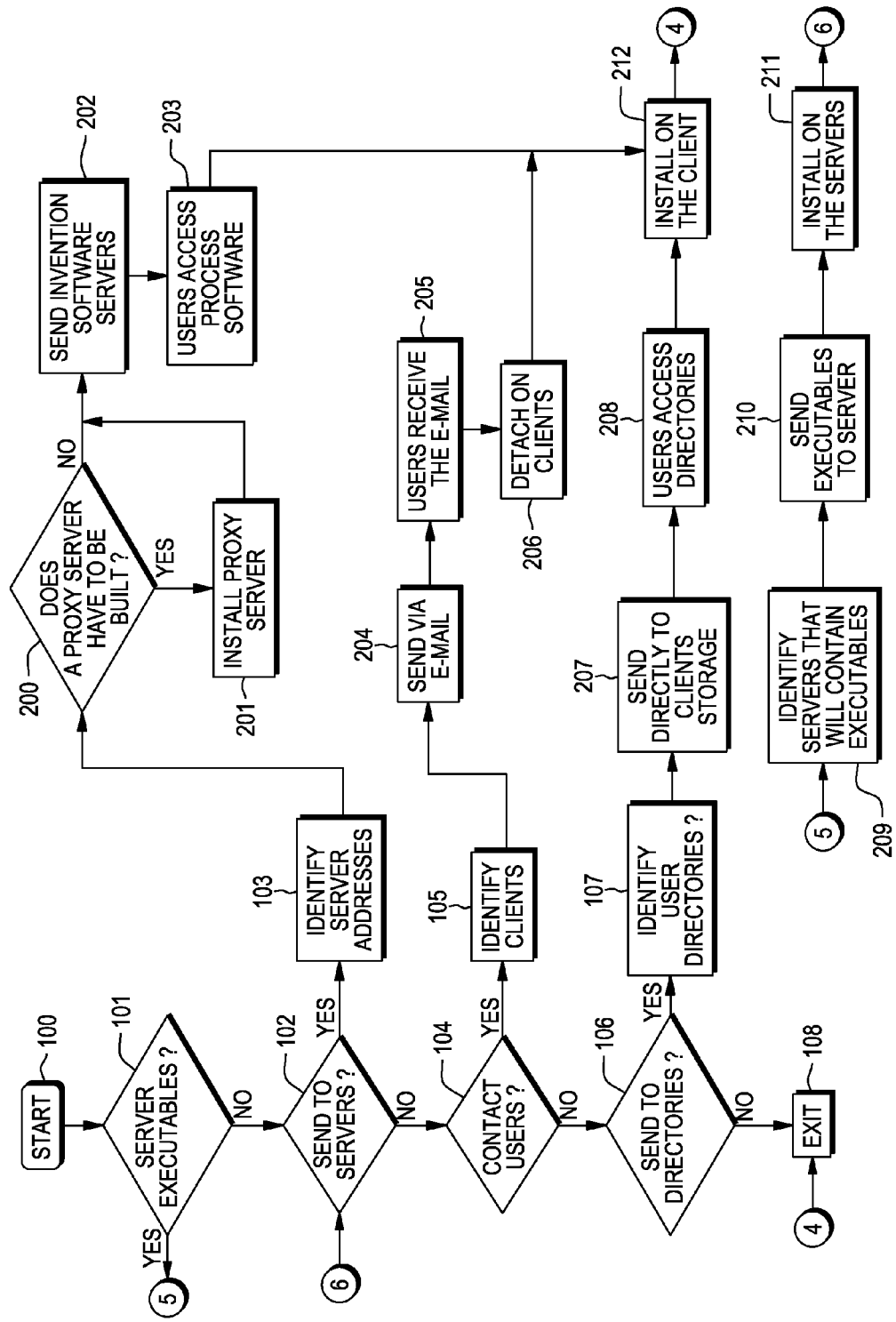
FIG. 10 is a schematic diagram of a deployment system according to embodiments herein.

As shown in FIG. 10, Step 100 begins the deployment of the process software. The first thing is to determine if there are any programs that will reside on a server or servers when the process software is executed 101. If this is the case, then the servers that will contain the executables are identified 209. The process software for the server or servers is transferred directly to the servers' storage via FTP or some other protocol or by copying though the use of a shared file system 210. The process software is then installed on the servers 211.

Next, a determination is made on whether the process software is be deployed by having users access the process software on a server or servers 102. If the users are to access the process software on servers, then the server addresses that will store the process software are identified 103.

A determination is made if a proxy server is to be built 200 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 201. The process software is sent to the servers either via a protocol such as FTP, or it is copied directly from the source files to the server files via file sharing 202. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 203. Another embodiment is to have the servers automatically copy the process software to each client, and then run the installation program for the process software at each client computer. The user executes the program that installs the process software on his client computer 212 then exits the process 108.

In step 104 a determination is made whether the process software is to be deployed by sending the process software to users via e-mail. The set of users where the process software will be deployed are identified together with the addresses of the user client computers 105. The process software is sent via e-mail to each of the users' client computers. The users then receive the e-mail 205 and then detach the process software from the e-mail to a directory on their client computers 206. The user executes the program that installs the process software on his client computer 212 then exits the process 108.

Lastly, a determination is made on whether to the process software will be sent directly to user directories on their client computers 106. If so, the user directories are identified 107. The process software is transferred directly to the user's client computer directory 207. This can be done in several ways such as, but not limited to, sharing of the file system directories and then copying from the sender's file system to the recipient user's file system or alternatively using a transfer protocol such as File Transfer Protocol (FTP). The users access the directories on their client file systems in preparation for installing the process software 208. The user executes the program that installs the process software on his client computer 212 then exits the process 108.

The process software which consists of is integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely, parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 11:
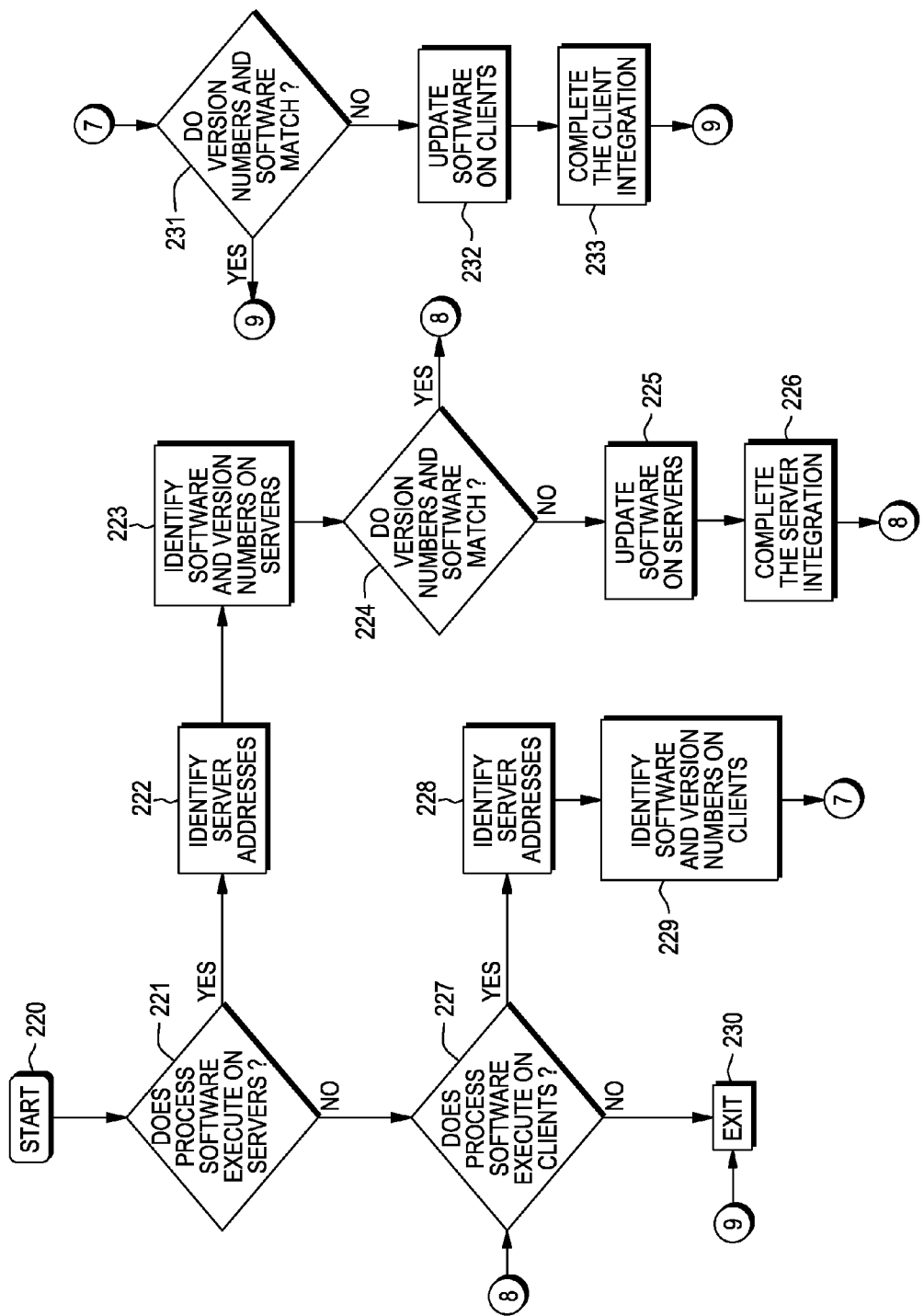
FIG. 11 is a schematic diagram of an integration system according to embodiments herein.

Referring now to FIG. 11, Step 220 begins the integration of the process software. The first thing is to determine if there are any process software programs that will execute on a server or servers 221. If this is not the case, then integration proceeds to 227. If this is the case, then the server addresses are identified 222. The servers are checked to see if they contain software that includes the operating system (OS), applications, and network operating systems (NOS), together with their version numbers, that have been tested with the process software 223. The servers are also checked to determine if there is any missing software that is required by the process software 223.

A determination is made if the version numbers match the version numbers of OS, applications and NOS that have been tested with the process software 224. If all of the versions match and there is no missing required software the integration continues in 227.

If one or more of the version numbers do not match, then the unmatched versions are updated on the server or servers with the correct versions 225. Additionally, if there is missing required software, then it is updated on the server or servers 225. The server integration is completed by installing the process software 226.

Step 227 which follows either 221, 224 or 226, determines if there are any programs of the process software that will execute on the clients. If no process software programs execute on the clients, the integration proceeds to 230 and exits. If this not the case, then the client addresses are identified 228.

The clients are checked to see if they contain software that includes the operating system (OS), applications, and network operating systems (NOS), together with their version numbers, that have been tested with the process software 229. The clients are also checked to determine if there is any missing software that is required by the process software 229.

A determination is made as to whether the version numbers match the version numbers of OS, applications and NOS that have been tested with the process software 231. If all of the versions match and there is no missing required software, then the integration proceeds to 230 and exits.

If one or more of the version numbers do not match, then the unmatched versions are updated on the clients with the correct versions 232. In addition, if there is missing required software then it is updated on the clients 232. The client integration is completed by installing the process software on the clients 233. The integration proceeds to 230 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise, when other measurements of use such as network bandwidth, memory usage, storage usage, etc., approach a capacity so as to effect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise when other measurements of use such as network bandwidth, memory usage, storage usage, etc. approach a capacity so as to effect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 12:
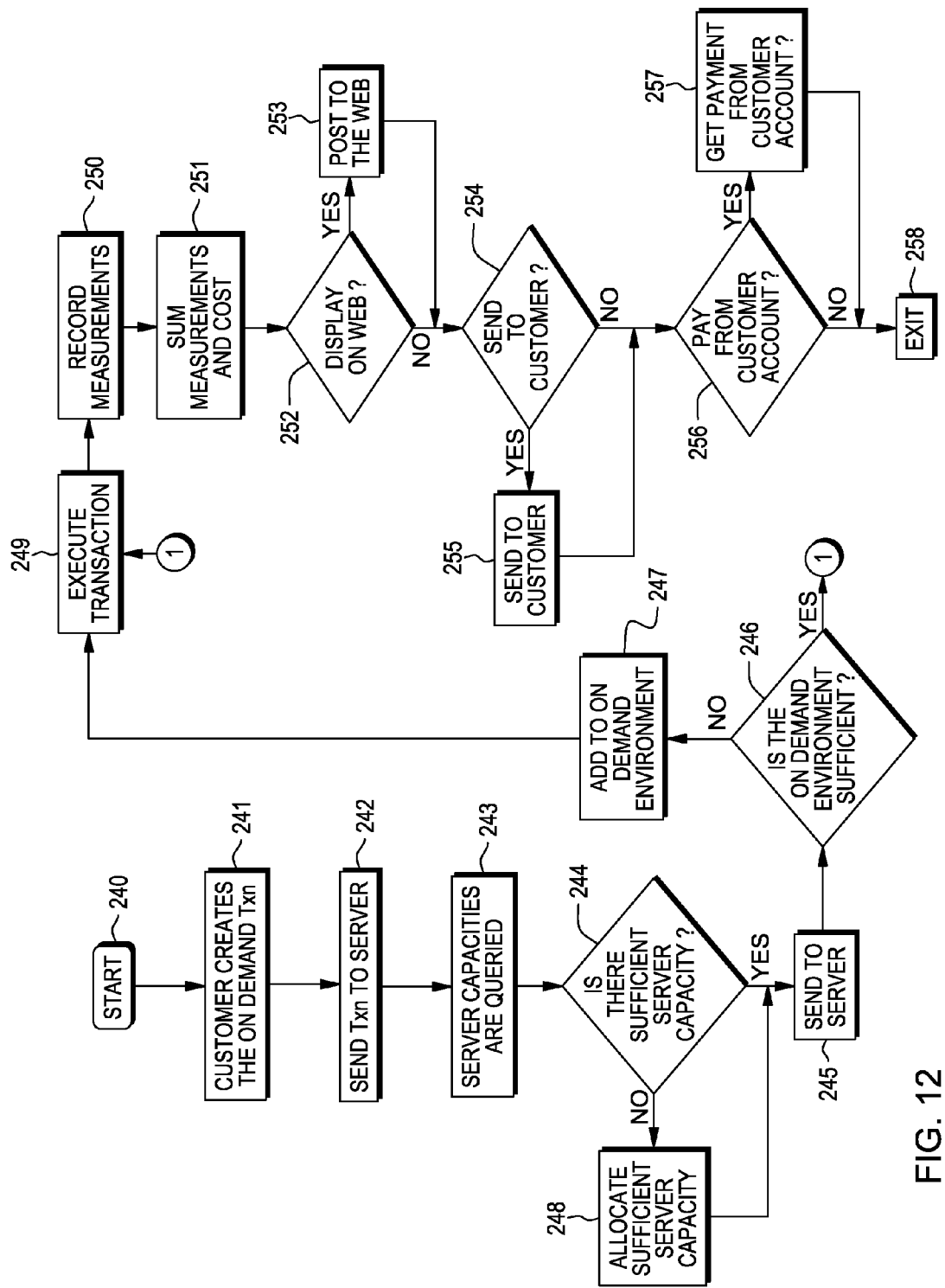
FIG. 12 is a schematic diagram of an on demand system according to embodiments herein.

As shown in FIG. 12, Step 240 begins the On Demand process. A transaction is created than contains the unique customer identification, the requested service type and any service parameters that further specify the type of service 241. The transaction is then sent to the main server 242. In an On Demand environment, the main server can initially be the only server, then as capacity is consumed, other servers are added to the On Demand environment.

The server central processing unit (CPU) capacities in the On Demand environment are queried 243. The CPU requirement of the transaction is estimated, then the servers available CPU capacity in the On Demand environment are compared to the transaction CPU requirement to see if there is sufficient CPU available capacity in any server to process the transaction 244. If there is not sufficient server CPU available capacity, then additional server CPU capacity is allocated to process the transaction 248. If there was already sufficient Available CPU capacity then the transaction is sent to a selected server 245.

Before executing the transaction, a check is made of the remaining On Demand environment to determine if the environment has sufficient available capacity for processing the transaction. This environment capacity consists of such things as but not limited to network bandwidth, processor memory, storage etc. 246. If there is not sufficient available capacity, then capacity will be added to the On Demand environment 247. Next the required software to process the transaction is accessed, loaded into memory, then the transaction is executed 249.

The usage measurements are recorded 250. The usage measurements consists of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer 251. If the customer has requested that the On Demand costs be posted to a web site 252 then they are posted 253.

If the customer has requested that the On Demand costs be sent via e-mail to a customer address 254 then they are sent 255. If the customer has requested that the On Demand costs be paid directly from a customer account 256 then payment is received directly from the customer account 257. The last step is exit the On Demand process.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling which is the process of placing an entire packet within another packet and sending it over a network. The protocol of the outer packet is understood by the network and both points, called tunnel interfaces, where the packet enters and exits the network.

Figure 13:
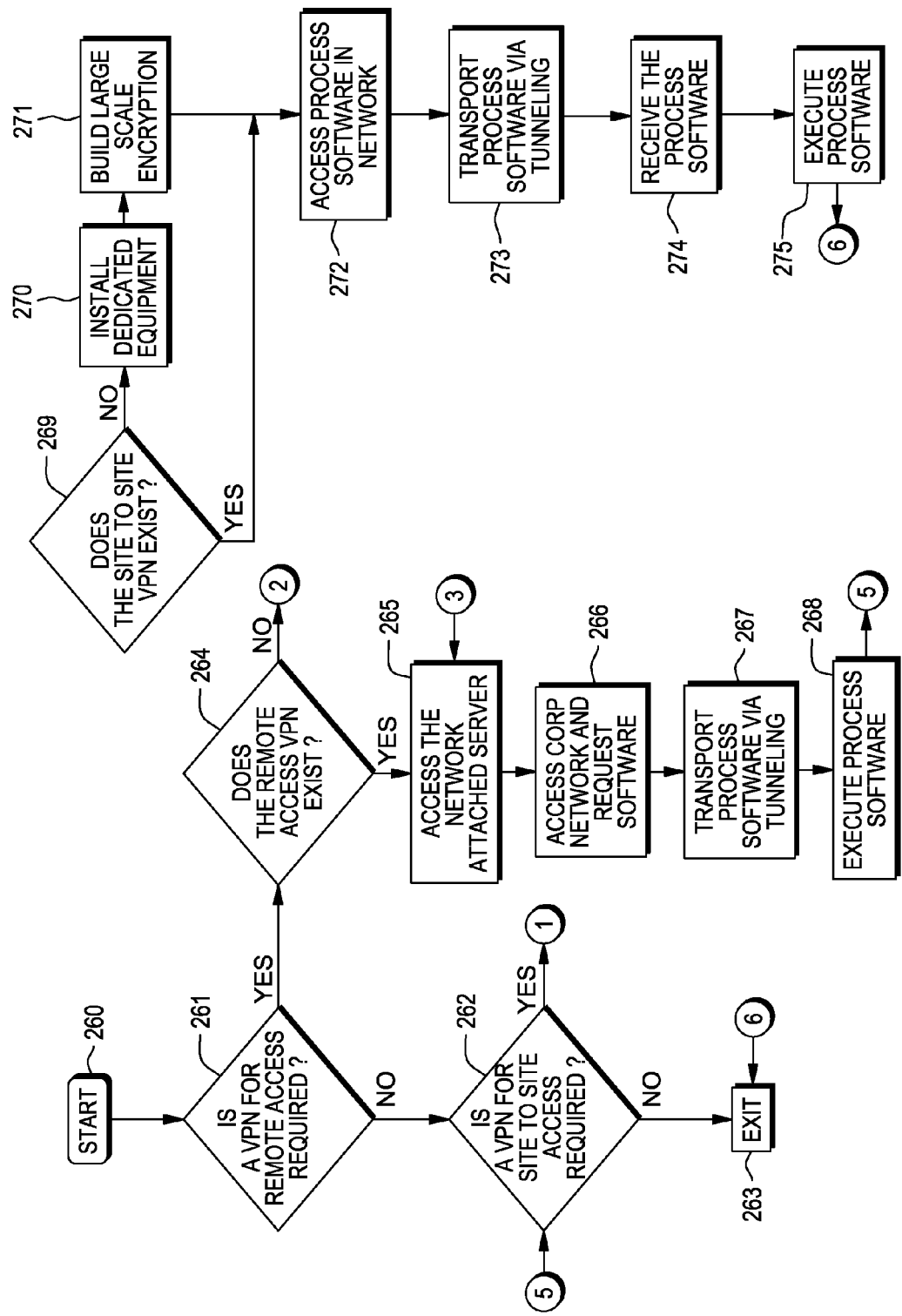
FIG. 13 is a schematic diagram of a virtual private network system according to embodiments herein.

As shown in FIG. 13, Step 260 begins the Virtual Private Network (VPN) process. A determination is made to see if a VPN for remote access is required 261. If it is not required, then proceed to 262. If it is required, then determine if the remote access VPN exists 264.

If it does exist, then proceed to 265. Otherwise identify the third party provider that will provide the secure, encrypted connections between the company's private network and the company's remote users 276. The company's remote users are identified 277. The third party provider then sets up a network access server (NAS) 278 that allows the remote users to dial a toll free number or attach directly via a cable or DSL modem to access, download and install the desktop client software for the remote-access VPN 279.

After the remote access VPN has been built or if it been previously installed, the remote users can then access the process software by dialing into the NAS or attaching directly via a cable or DSL modem into the NAS 265. This allows entry into the corporate network where the process software is accessed 266. The process software is transported to the remote user's desktop over the network via tunneling. That is the process software is divided into packets and each packet including the data and protocol is placed within another packet 267. When the process software arrives at the remote user's desktop, it is removed from the packets, reconstituted and then is executed on the remote users desktop 268.

A determination is made to see if a VPN for site to site access is required 262. If it is not required, then proceed to exit the process 263. Otherwise, determine if the site to site VPN exists 269. If it does exist, then proceed to 272. Otherwise, install the dedicated equipment required to establish a site to site VPN 270. Then build the large scale encryption into the VPN 271.

After the site to site VPN has been built or if it had been previously established, the users access the process software via the VPN 272. The process software is transported to the site users over the network via tunneling. That is the process software is divided into packets and each packet including the data and protocol is placed within another packet 274. When the process software arrives at the remote user's desktop, it is removed from the packets, reconstituted and is executed on the site users desktop 275. Proceed to exit the process 263.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method for determining resistance, said method comprising:
   receiving, by a computerized device, a structural design comprising a conductor having a first conductor portion and a second conductor portion, a first wire connected to said first conductor portion, a second wire connected to said second conductor portion, and a node connected to said first wire and said second wire, said first wire having a first length between said first conductor portion and said node, said second wire having a second length between said second conductor portion and said node, said first length being different from said second length;
   determining, using said computerized device, a first resistance value comprising resistances of said first wire and said first conductor portion;
   determining, using said computerized device, a second resistance value comprising resistances of said second wire and said second conductor portion, said first resistance value being different from said second resistance value;
   determining, using said computerized device, a first fraction of current that will flow from said node through said first wire and said first conductor portion and a second fraction of current that will flow from said node through said second wire and said second conductor portion based on differences between said first resistance value and said second resistance value; and
   calculating, using said computerized device, a final total resistance value of said conductor, said first wire, and said second wire based on said first fraction of current and said first resistance value, and based on said second fraction of current and said second resistance value.

2. The computer-implemented method according to claim 1, at least one of said first wire and said second wire comprising more than one wire.

3. The computer-implemented method according to claim 1, said conductor comprising a polysilicon conductor,
   said first wire and said second wire comprising metallic conductors, and
   said first wire and said second wire being connected to said polysilicon conductor through conductive contacts.

4. The computer-implemented method according to claim 1, said conductor, said first wire, and said second wire comprising a polysilicon conductor.

5. The computer-implemented method according to claim 1, further comprising outputting said final total resistance value from said computerized device.

6. The computer-implemented method according to claim 1, said final total resistance value comprising a weighted sum of resistance values of all resistive elements including polysilicons, wires, and contacts with the weight for each resistive element as the square of the fraction of the electric current passes through said resistive element.

7. A computer-implemented method for determining resistance, said method comprising:
   receiving, by a computerized device, a structural design comprising a conductor and a node connected to a node connection location of said conductor, said conductor having an elongated base and a plurality of parallel finger projections extending from said base, said finger projections extending in a direction perpendicular to a linear direction of said base;
   determining, using said computerized device, a plurality of finger projection resistance values, one for each of said finger projections, each finger projection resistance value including a resistance of a corresponding finger projection of said finger projections and a portion of said base between said node connection location and a second location where said corresponding finger projection contacts said base;
   determining, using said computerized device, a separate fraction of current that will flow from said node connection location to each of said finger projections based on differences between said finger projection resistance values; and
   calculating, using said computerized device, a final total resistance value of said base and said finger projections based on said fraction of current that will flow to each of said finger projections and each of said finger projection resistance values.

8. The computer-implemented method according to claim 7, said node connection location being at one of an end of said base and a center of said base.

9. The computer-implemented method according to claim 7, said base and said finger projections comprising a polysilicon conductor.

10. The computer-implemented method according to claim 7, said base comprising a metallic conductor, and said finger projections comprising a polysilicon conductor.

11. The computer-implemented method according to claim 7, further comprising outputting said final total resistance value from said computerized device.

12. The computer-implemented method according to claim 7, said final total resistance value comprising a weighted sum of resistance values of all resistive elements including polysilicons, wires, and contacts with the weight for each resistive element as the square of the fraction of the electric current that passes through said resistive element.

13. A computer-implemented method for determining resistance, said method comprising:
   receiving, by a computerized device, a structural design comprising a conductor, and a plurality of different length wires connected to wire connection locations of said conductor, said conductor having a plurality of elongated bases, said wires connecting to a single node;
   determining, using said computerized device, a plurality of wire-base resistance values, one for each of said bases through each of said wires, each wire-base resistance value including a resistance of a corresponding wire of said wires, and a corresponding base of said bases;
   determining, using said computerized device, a separate fraction of current that will flow from a node connection location through each of said wires to each of said bases based on differences between said wire-base resistance values; and
   calculating, using said computerized device, a final total resistance value of said wires and said bases based on said fraction of current that will flow to each of said bases and each of said wire-base resistance values.

14. The computer-implemented method according to claim 13, said wire connection locations being at ends of said base or center locations of said base.

15. The computer-implemented method according to claim 13, said wires and said base comprising a polysilicon conductor.

16. The computer-implemented method according to claim 13, said wires and said base comprising metallic conductors.

17. The computer-implemented method according to claim 13, further comprising outputting said final total resistance value from said computerized device.

18. The computer-implemented method according to claim 7, said final total resistance value comprising a weighted sum of resistance values of all resistive elements including polysilicons, wires, and contacts with the weight for each resistive element as the square of the fraction of the electric current that passes through said resistive element.

19. A computer storage device comprising a tangible storage medium readable by a computerized device, said tangible storage medium storing instructions executable by said computerized device to perform a method for determining resistance, said method comprising:
 receiving a structural design comprising a conductor having a first conductor portion and a second conductor portion, a first wire connected to said first conductor portion, a second wire connected to said second conductor portion, and a node connected to said first wire and said second wire, said first wire having a first length between said first conductor portion and said node, said second wire having a second length between said second conductor portion and said node, said first length being different from said second length;
 determining a first resistance value comprising resistances of said first wire and said first conductor portion;
 determining a second resistance value comprising resistances of said second wire and said second conductor portion, said first resistance value being different from said second resistance value;
 determining a first fraction of current that will flow from said node through said first wire and said first conductor portion and a second fraction of current that will flow from said node through said second wire and said second conductor portion based on differences between said first resistance value and said second resistance value; and
 calculating a final total resistance value of said conductor, said first wire, and said second wire based on said first fraction of current and said first resistance value, and based on said second fraction of current and said second resistance value.

20. The computer storage device according to claim 19, at least one of said first wire and said second wire comprising more than one wire.

21. The computer storage device according to claim 19, said conductor comprising a polysilicon conductor,
 said first wire and said second wire comprising metallic conductors, and
 said first wire and said second wire being connected to said polysilicon conductor through conductive contacts.

22. The computer storage device according to claim 19, said conductor, said first wire, and said second wire comprising a polysilicon conductor.

23. The computer storage device according to claim 19, said method further comprising outputting said final total resistance value from said computerized device.

24. The computer storage device according to claim 19, said structural design comprising a transistor and said conductor comprising a gate conductor.

* * * * *